(12) United States Patent
Higashi et al.

(10) Patent No.: US 7,191,033 B2
(45) Date of Patent: Mar. 13, 2007

(54) SUBSTRATE PROCESSING APPARATUS AND SUBSTRATE PROCESSING METHOD

(75) Inventors: Makio Higashi, Tokyo (JP); Akira Miyata, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 175 days.

(21) Appl. No.: 11/028,316

(22) Filed: Jan. 4, 2005

(65) Prior Publication Data

US 2005/0197729 A1     Sep. 8, 2005

(30) Foreign Application Priority Data

Mar. 3, 2004    (JP)    ............................. 2004-059478

(51) Int. Cl.
*G06F 7/00* (2006.01)
(52) U.S. Cl. ........................ 700/213; 700/121; 414/935
(58) Field of Classification Search ................ 700/213, 700/214, 121; 414/935, 939
See application file for complete search history.

(56) References Cited

U.S. PATENT DOCUMENTS 6,507,770 B2    1/2003  Tateyama et al.
6,640,148 B1 *  10/2003 Miller et al. ................. 700/103
2004/0078109 A1 *  4/2004 Babikian et al. ............ 700/121

FOREIGN PATENT DOCUMENTS

JP    2001-351848    12/2001

OTHER PUBLICATIONS

U.S. Appl. No. 11/028,315, filed Jan. 4, 2005, Higashi et al.
U.S. Appl. No. 11/028,316, filed Jan. 4, 2005, Higashi et al.

* cited by examiner

*Primary Examiner*—Khoi H. Tran

(57) ABSTRACT

A substrate processing apparatus having a recipe storage section, a transfer control section and a transfer schedule changing section which, when delivery of an n-th substrate from a transfer art to the previous module is delayed by "m" cycles, changes a transfer schedule so as to move each of n-th and subsequent substrates (including the n-th substrate) in the transfer schedule to a module to which an "m"-th substrate following the substrate has been allocated, and transferring the changed transfer schedule data to the transfer control section.

7 Claims, 23 Drawing Sheets

| Phase | MOD | MOD1 | MOD2 | MOD3 |
|---|---|---|---|---|
| 1 | W1 | | | |
| 2 | W2 | W1 | | |
| 3 | W3 | W1 | W2 | |
| 4 | W4 | W1 | W2 | W3 |
| 5 | W5 | W4 | W2 | W3 |
| 6 | W6 | W4 | W5 | W3 |
| 7 | W7 | W4 | W5 | W6 |
| 8 | | W7 | W5 | W6 |
| 9 | | W7 | | W6 |
| 10 | | W7 | | |
| 11 | | | | |

| Phase | MOD | MOD1 | MOD2 | MOD3 |
|---|---|---|---|---|
| 1 | W1 | | | |
| 2 | | W1 | | |
| 3 | W2 | W1 | | |
| 4 | W3 | W1 | W2 | |
| 5 | W4 | | W2 | W3 |
| 6 | W5 | W4 | W2 | W3 |
| 7 | W6 | W4 | W5 | W3 |
| 8 | W7 | W4 | W5 | W6 |
| 9 | | W7 | W5 | W6 |
| 10 | | W7 | | W6 |
| 11 | | W7 | | |

FIG. 3A
| Phase | MOD | MOD1 | MOD2 | MOD3 |
|---|---|---|---|---|
| 1 | W1 | | | |
| 2 | W2 | W1 | | |
| 3 | W3 | W1 | W2 | |
| 4 | W4 | W1 | W2 | W3 |
| 5 | W5 | W4 | W2 | W3 |
| 6 | W6 | W4 | W5 | W3 |
| 7 | W7 | W4 | W5 | W6 |
| 8 | | W7 | W5 | W6 |
| 9 | | W7 | | W6 |
| 10 | | W7 | | |
| 11 | | | | |
FIG. 3B
| Phase | MOD | MOD1 | MOD2 | MOD3 |
|---|---|---|---|---|
| 1 | W1 | | | |
| 2 | W2 | W1 | | |
| 3 | W3 | W1 | W2 | |
| 4 | W4 | W1 | W2 | W3 |
| 5 | W5 | W4 | W2 | W3 |
| 6 | W6 | W4 | W5 | W3 |
| 7 | W7 | W4 | W5 | W6 |
| 8 | | W7 | W5 | W6 |
| 9 | | W7 | | W6 |
| 10 | | W7 | | |
| 11 | | | | |
FIG. 3C
| Phase | MOD | MOD1 | MOD2 | MOD3 |
|---|---|---|---|---|
| 1 | W1 | | | |
| 2 | | W1 | | |
| 3 | W2 | W1 | | |
| 4 | W3 | W1 | | W2 |
| 5 | W4 | W3 | | W2 |
| 6 | W5 | W3 | W4 | W2 |
| 7 | W6 | W3 | W4 | W5 |
| 8 | W7 | W6 | W4 | W5 |
| 9 | | W6 | W7 | W5 |
| 10 | | W6 | W7 | |
| 11 | | | W7 | |

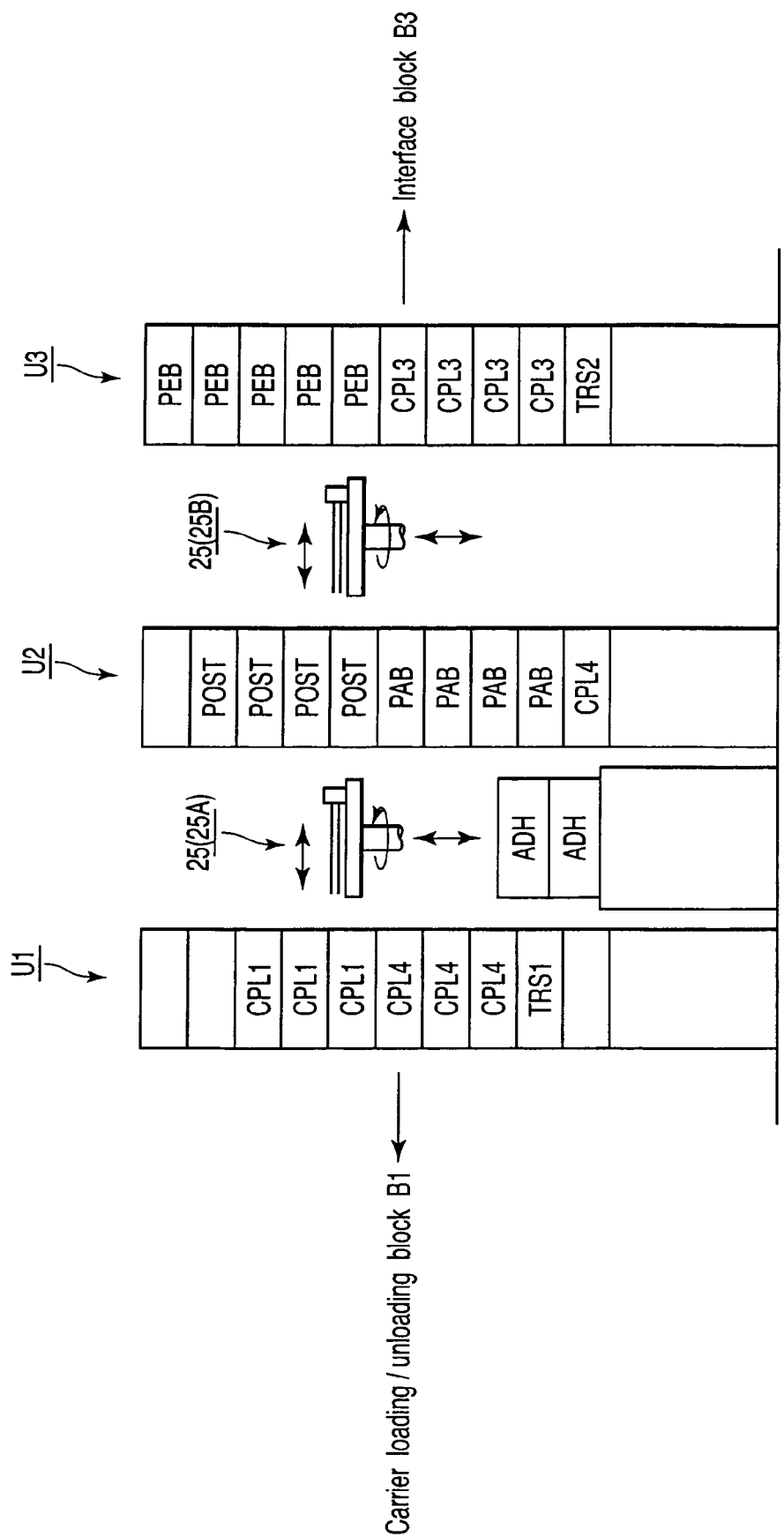
F I G. 6

| Phase | MOD | MOD1 | MOD2 | MOD3 | MOD4 |
|---|---|---|---|---|---|
| 1 | A1 | | | | |
| 2 | A2 | A1 | | | |
| 3 | | A1 | A2 | | |
| 4 | A3 | A1 | A2 | | |
| 5 | A4 | A3 | A2 | | |
| 6 | | A3 | A4 | | |
| 7 | | A3 | A4 | | |
| 8 | A5 | | A4 | | |
| 9 | A6 | | A5 | | |
| 10 | A7 | | A5 | A6 | |
| 11 | B1 | A7 | A5 | A6 | |
| 12 | B2 | A7 | B1 | A6 | |
| 13 | B3 | A7 | B1 | | B2 |
| 14 | B4 | B3 | B1 | | B2 |
| 15 | B5 | B3 | B4 | | B2 |
| 16 | | B3 | B4 | | B5 |
| 17 | | | B4 | | B5 |
| 18 | | | | | B5 |

FIG. 20A
FIG. 20B

SUBSTRATE PROCESSING APPARATUS AND SUBSTRATE PROCESSING METHOD

CROSS-REFERENCE TO RELATED APPLICATIONS

This application is based upon and claims the benefit of priority from prior Japanese Patent Application No. 2004-059478, filed Mar. 3, 2004, the entire contents of which are incorporated herein by reference.

BACKGROUND OF THE INVENTION

1. Field of the Invention

The present invention relates to a substrate processing apparatus and a substrate processing method for carrying out a photolithography process for a semiconductor wafer or a glass substrate (LCD substrate) for a liquid crystal display.

2. Description of the Related Art

A substrate processing apparatus (system) is configured in combination between a coating and developing device and an exposure device in order to execute a series of processes applying a photolithography technique. For example, a conventional system described in U.S. Pat. No. 6,507,770 comprises a carrier placement block 1A, a process block 1B, an interface block 1C, and an exposure system 1D, as shown in FIG. 1. A wafer W is taken out from a carrier C of the carrier placement block 1A by a delivery arm 11. The taken-out wafer is transported to the process block 1B via a delivery unit of a rack unit 13a. Subsequently, the transported wafer is transported and processed in a predetermined processing unit in a predetermined order, and the wafer is coated with a resist liquid. Thereafter, the coated wafer is transported to the exposure system 1D via the interface block 1C, and a resist film is subjected to pattern exposure. Then, the wafer W is returned to the process block 1B again after the exposure, is subjected to post exposure baking process (PEB) by a baking unit. The baked wafer is cooled by a cooling unit, and is processed to be developed by a developing unit.

In the meantime, in a conventional system, a plurality wafers W are continuously processed in parallel. Thus, in the system, a transfer schedule of the wafers W is programmed in advance so that the wafers W are transported through a predetermined passage. The transfer schedule is predetermined so that, when a plurality of wafers W (all the wafers in one lot or all the wafers belonging to a plurality of lots) are continuously processed in parallel, each of the wafers W is transported to a predetermined module at a predetermined timing. All the wafers in the system are transferred in accordance with this transfer schedule.

A conventional transfer schedule will be described with reference to FIG. 2A. The conventional transfer schedule is provided as a table showing in time series timings of transferring wafers W1 to W7 to a previous module MOD and three multi-modules (MOD1, MOD2, MOD3). The wafer 1 indicates a first wafer in the lot, and the wafer 2 indicates a second wafer in the lot, respectively.

Now, how to read the transfer schedule will be briefly described here. In a phase 1 of FIG. 2A, there is shown that the wafer W1 is transported to the previous module MOD. In a phase 2, there is shown that the wafer W1 is transported to the multi-module MOD1, and the wafer W2 is transported to the previous module MOD, respectively.

Here, transfer means comprises two or more arms. Thus, the wafer is received by one arm with respect to one module, and then, the wafer is delivered by the other arm. Therefore, in a phase 5, the transfer means receives the wafer W4 in the previous module MOD by one arm, transports the wafer W5 to the previous module MOD by the other arm, and transports the wafer W4 held by the one arm to the multi-module MOD1. In the multi-module MOD1, the transfer means first receives the wafer W1 in the multi-module MOD1 by the other arm thereof, and delivers the wafer W4 held by the one arm to the module MOD1. In this manner, a replacing operation between the wafer W1 and the wafer W4 is carried out in the multi-module MOD1, and the wafer W1 exported from the multi-module MOD1 is transported to a module in a next process of the multi-module by the transfer means.

Here, in order to enhance throughput, in the transfer schedule, when subsequent wafers are transported to multi-modules in which preceding wafers in the same lot have been processed, scheduling is carried out so as to always carry out a replacing operation.

In the meantime, in the exposure system 1D, when a time is required for reticule replacement while in lot change or when an alarm sounds, a wafer may not be exported from the exposure device at a predetermined timing in accordance with the transfer schedule. A delay time of processing in the exposure system 1D cannot be recognized in a module at the side of a processing block 1B. Thus, there is a case in which the wafer W cannot be transferred in accordance with the original transfer schedule. At this time, the transfer schedule is currently changed as shown in FIG. 2B.

This transfer schedule shows an example in which delivery of the wafer W2 in the phase 2 is delayed, and the wafer W2 is transported to the previous module MOD in the phase 3. If delivery of the wafer W2 is thus delayed, the wafer 2 is transported to the multi-module MOD2 in the phase 4. Thus, a timing at which the subsequent wafer W3 is transported to the multi-modules MOD1 to MOD3 is shifted to an immediately following phase in order. In this manner, in the phase 5, a blank occurs at the multi-module MOD1, so that, when the wafer W4 is transported to the multi-module MOD1, the replacing operation between the wafer W1 and the wafer W4 cannot be carried out.

Namely, in the phase 5, the transfer means receives the wafer W3 in the previous module MOD by one arm, and delivers the wafer W4 to the previous module MOD by the other arm. Then, the transfer means transfers the wafer W3 held by the one arm, receives the processed wafer W1 from the multi-module MOD1, and transfers the wafer 1 to a module in a next process. Then, in the phase 6, the transfer means receives the wafer W4 in the previous module MOD, delivers the wafer W5 to the previous module MOD, and transfers the wafer W4 to the multi-module MOD1. At this time, in the multi-module MOD1, although the wafer W1 does not exist because the wafer has been exported in the phase 5, the transfer means always operates so as to first receive a wafer from a module, and then, deliver the wafer to the module. Therefore, freewheeling wafer taking operation (an operation in which a wafer is not actually held) is carried out by one arm of the transfer means, and the wafer W4 of the one arm is delivered to the multi-module MOD1.

In this manner, in the multi-module MOD1, the wafer W1 and the wafer W4 cannot be replaced with each other, and a process for receiving the wafer W1 from the multi-module MOD1 and a freewheeling taking process in the multi-module MOD1 will increase. Thus, as described previously, if there occurs a case in which delivery for the previous module MOD is delayed, the replacing operation cannot be carried out. Therefore, there occurs a danger that throughput is lowered.

BRIEF SUMMARY OF THE INVENTION

It is an object of the present invention to provide a substrate processing apparatus and a substrate processing method capable of restricting the lowering of throughput by changing a multi-module to which a substrate is to be transported, in order to prevent freewheeling taking of a substrate in a multi-module even when delivery of a substrate has been delayed in a module whose sequence immediately precedes the multi-module.

According to an aspect of the present invention, there is provided a substrate processing apparatus comprising:

a module group which sequentially processes a plurality of substrates in parallel, the module group having multi-modules substrates to be transferred in identical order and composed of a plurality of modules which carry out identical processing for substrates, and including a previous module to which substrates are transferred immediately before the multi-modules;

a delivery mechanism configured to deliver substrates to the previous module; and a plurality of transfer mechanism configured to transfer substrates, respectively, to modules in the module group, the apparatus comprising:

a recipe storage section which allocates a sequence to a substrate so that the substrates are delivered in a predetermined sequence from the previous module to each module of the multi-modules, specifies a transfer cycle by associating the sequence of the substrate with said each module, creates a transfer schedule by arranging the specified transfer cycle data in time series, and stores the created transfer schedule;

a transfer control section which calls the transfer schedule from the recipe storage section, and controls the transfer mechanism so as to transfer a substrate written into the transfer cycle data to a module which corresponds to the substrate; and a transfer schedule changing section which, when delivery of an n-th substrate from the delivery mechanism to the previous module is delayed by "m" cycles, changes the transfer schedule so as to move each of n-th and subsequent substrates (including the n-th substrate) in the transfer schedule to a module to which an "m"-th substrate following the substrate has been allocated, and transfers the changed transfer schedule data to the transfer control section.

According to another aspect of the present invention, there is provided a substrate processing method for distributing substrates in a predetermined order from the previous module to each module of the multi-modules, the method comprising:

(a) a step of allocating a sequence to a substrate so that the substrates are delivered in a predetermined sequence from the previous module to each module of the multi-modules, specifying a transfer cycle by associating the sequence of the substrate with said each module; creating a transfer schedule by arranging the specified transfer cycle data in time series, referring to the created transfer schedule, and transferring a substrate written in the transfer cycle data by the transfer mechanism to a module which corresponds to the substrate;

(b) a step of calling the transfer schedule, and controlling the transfer mechanism so as to transfer a substrate written into the transfer cycle data to a module which corresponds to the substrate;

(c) a step of, when delivery of an n-th substrate from the delivery mechanism to the previous module is delayed by "m" cycles, changing the transfer schedule so as to move each of n-th and subsequent substrates (including the n-th substrate) in the transfer schedule to a module to which an "m"-th substrate following the substrate has been allocated; and (d) a step of, referring to the changed transfer schedule, transferring a substrate written in the transfer cycle data to a module which corresponds to the substrate.

According to another aspect of the present invention, there is provided a program to be executed by a computer system, the program comprising:

(a) a procedure for executing processing of allocating a sequence to a substrate so that substrates are delivered in a predetermined sequence from a previous module to each module of multi-modules, specifying a transfer cycle by associating the sequence of the substrate with said each module, creating a transfer schedule by arranging the specified transfer cycle data in time series, referring to the created transfer schedule, and transferring a substrate written in to the transfer cycle data to a module which corresponds to the substrate;

(b) a procedure for executing processing of calling the transfer schedule, and controlling a transfer mechanism so as to transfer a substrate written into the transfer cycle data to a module which corresponds to the substrate;

(c) a procedure for executing processing of, when delivery of an n-th substrate from delivery means to the previous module is delayed by "m" cycles, changing the transfer schedule so as to move each of n-th and subsequent substrates (including the n-th substrate) in the transfer schedule to a module to which an "m"-th substrate following the substrate has been allocated; and (d) a procedure for executing processing of referring to the changed transfer schedule, and causing the transfer mechanism to transfer a substrate written in the transfer cycle data to a module which corresponds to the substrate.

In the present specification, a portion at which a substrate stays for a predetermined period of time in order to transfer or process the substrate is referred to as a "module". A typical example of the module for the purpose of transferring the substrate includes a delivery unit (TRS) which comprises a placement base on which the substrate is to be placed. In addition, a typical example of the module for the purpose of processing the substrate includes a coating unit (COT) or a developing unit (DEV).

In addition, in the present specification, a plurality of processing units whose transfer sequences are identical to each other, the processing units carrying out the same processes for the substrates, are referred to as a "multi-module". Typical examples of the multi-modules include: a coating unit (COT), a developing unit (DEV), an adhesion unit (ADH), baking units (PAB, PEB, POST), and a temperature control unit (CPL).

Further, in the present specification, a process unit in a previous process of a multi-module is referred to as a "previous module". A typical example of the previous module includes a delivery unit (TRS).

BRIEF DESCRIPTION OF THE SEVERAL VIEWS OF THE DRAWING

FIGS. 3A to 3C are tables each showing a transfer schedule before and after changed as an example of the present invention;

FIG. 6 is a schematic side view showing a rack unit of the substrate processing apparatus;

FIGS. 15A and 15B are tables each showing a transfer schedule before and after changed as an example of the present invention;

FIGS. 20A and 20B are tables each showing a transfer schedule before and after changed as an example of the present invention;

DETAILED DESCRIPTION OF THE INVENTION

Figure 1:
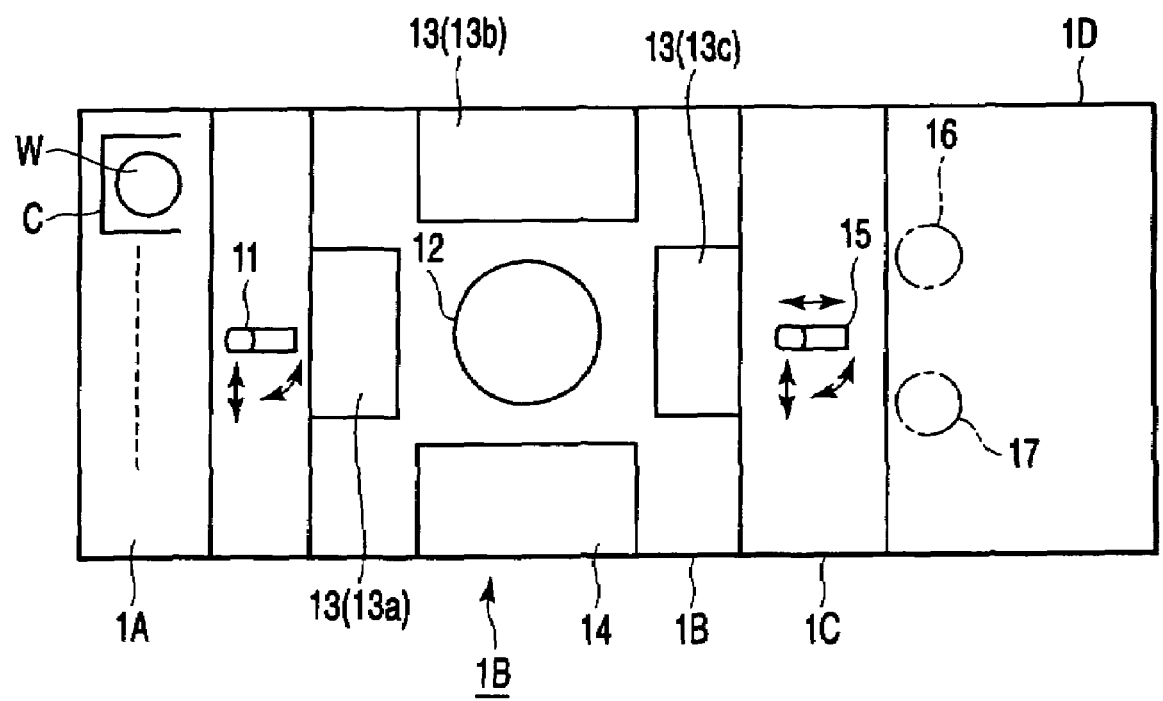
FIG. 1 is a schematic plan view showing a conventional apparatus.
Figures 2A, 2B:
FIG. 2A is a table showing a conventional transfer schedule.
FIG. 2B is a table showing a conventional transfer schedule after changed.
Figure 4:
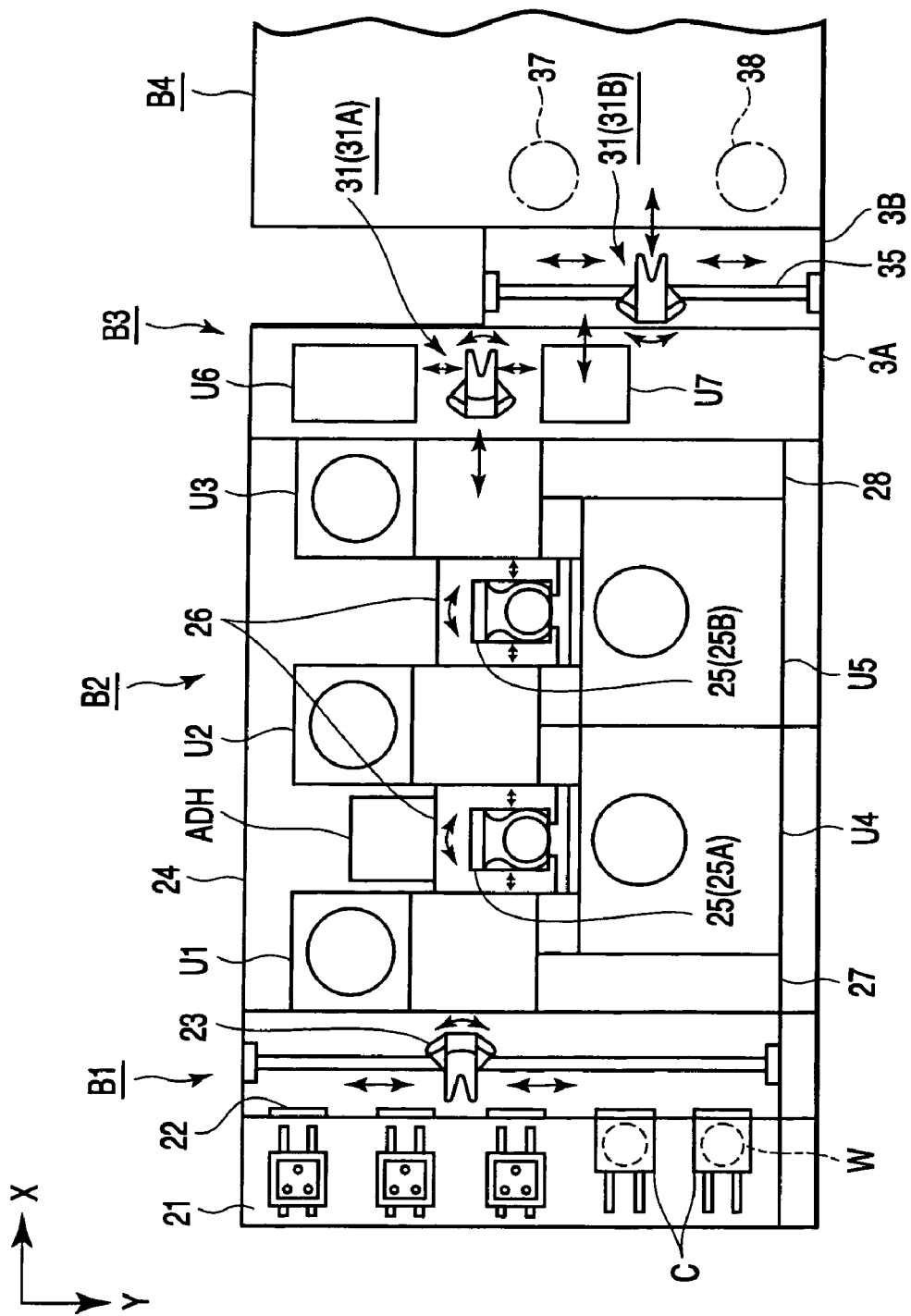
FIG. 4 is a schematic plan view of a substrate processing apparatus.

Hereinafter, a variety of preferred embodiments of the present invention will be described with reference to the accompanying drawings.

A substrate processing apparatus according to the present invention is featured by a transport technique in which, in the case where a portion at which wafers W being substrates are placed and are predetermined in transfer sequence is referred to as a module group, and a plurality of modules whose transfer sequences are identical to each other, and in which a same process is carried out for the wafer W is referred to as "multi-modules", the wafer W is transfer by transfer means comprising two or more arms to the multi-module from a previous module provided at a previous stage of the multi-module.

Now, a general description of a transfer schedule will be described with reference to FIGS. 3A to 3C.

In the substrate processing apparatus, a wafer W is taken out from one module by transfer means, a wafer W in a next module is received, and the previous wafer W is delivered to the next module. The thus placed wafers W in the modules each are shifted to an immediately following sequence in order, thereby executing one transfer cycle. After the one transfer cycle has been executed, processing goes to a next transfer cycle in which transfer cycles are sequentially executed, whereby the wafers W are sequentially transported in ascending order from the lowest number module to the highest number module to be subjected to a predetermined processing. During a normal mode, the substrates are distributed in predetermined order from the previous module with respect to each module of the multi-modules.

FIG. 3A shows a transfer schedule during a normal mode when wafers W1 to W7 are transported from a previous module MOD, for example, to three multi-modules (MOD1, MOD2, MOD3). The transfer schedule used here denotes a schedule in which transfer cycle data specifying a transfer cycle (phase) are arranged in time series by associating the sequence of wafers W and modules. In this example, there is shown that, in a phase 1, the first wafer W1 is transported to the previous module MOD and that, in a phase 2, the first wafer W1 is transported to the multi-module MOD1, and the second wafer W2 next to the first wafer is transported to the previous module MOD.

FIG. 3B is a transfer schedule table showing procedures for changing transfer sequences in the case where delivery of the wafers W to the previous module MOD is delayed by virtue of a predetermined reason. The "predetermined reason" used here denotes a case in which temperature control of a substrate (before resist coated) at a carrier placement block B1 becomes overtime or a case in which temperature control of a substrate (after exposed and before developed) at an interface block B3 becomes overtime.

The substrate processing apparatus always monitors a processing state of a wafer W, and recognizes that delivery of the wafer W to the previous module MOD has been delayed, and at this time, a transfer schedule is changed. For example, in the previous module MOD, when delivery of an n-th wafer W is delayed by "m" transfer cycles, scheduling is changed so that the wafers W each are moved to a module in which an m-th wafer W following each wafer has been allocated, with respect to the transfer schedule including the n-th and subsequent wafers W (including the n-th wafer) from among the transfer schedules of the multi-modules (MOD1, MOD2, MOD3).

In this example, there is shown a case in which delivery of the wafers W2 to W7 has been delayed by one transfer cycle. Thus, the first wafer W1 is transferred in accordance with the transfer schedule during the normal mode (hereinafter, referred to as a "basic transfer schedule"). In the second to sixth wafers W2 to W6, modules, each of which is a transfer destination, are shifted such that the third to seventh wafers W3 to W7 are to be transported, the wafers corresponding to the m-th wafers following the second to sixth wafers, respectively (immediately following wafer in this case).

In addition, although delivery of the seventh wafer W7 is delayed by one cycle, the basic transfer schedule does not include an eighth wafer which corresponds to an "m"-th wafer following the wafer W7 (immediately following wafer in this case). Therefore, in a transfer schedule after changed, a transfer destination is shifted to a module in which the immediately preceding wafer W6 can be transferred to a phase 9 which immediately follows a phase 8 in which the wafer W6 is to be transferred to the module.

FIG. 3C shows a transfer schedule after the current schedule has been thus changed.

Now, a substrate processing apparatus of the present embodiment will be described with reference to FIGS. 4 to 8.

In the figures, reference numeral B1 denotes a carrier placement block for importing a carrier C in which, for example, 13 wafers have been sealed and housed. The carrier placement block B1 has a placement base 21 and a transfer arm 23. On a side face of the placement base 21, a plurality of opening and closing sections 22 are provided, respectively, in location corresponding to the carrier C. The transfer arm 23 has a plurality of arm holders for holding wafers W, and comprises an arm holder advancing and retracting mechanism, a Y driving mechanism, a Z driving mechanism, and a θ driving mechanism which are not shown. By opening the opening and closing section 22, the arm holders of the transfer arm 23 are intruded into the carrier C via the opening and closing section 22 so that the wafer W can be taken out from the carrier C.

A processing block B2 whose periphery is surrounded by a housing 24 is connected rear of the carrier placement block B1. In this processing block B2, there are arranged alternately from the front side: three rack units U1, U2, U3 whose heating and cooling units are multi-staged; and a main transfer mechanism 25 (25A, 25B) which is transfer means rotatable which is retractable, is freely elevated, and is rotatable along a vertical shaft, the means delivering the wafer W between units each including various other units described later. That is, the rack units U1, U2, U3 and the main transfer mechanism 25 (25A, 25B) are arranged forwardly and backwardly in one line, viewed from the side of the carrier replacement block B1. At each connection portion, an opening (not shown) for wafer transportation is formed, so that the wafer W can be freely moved from the rack unit U1 at one end of the processing block B2 to the rack unit U3 at the other end thereof. The main transfer mechanism 25 (25A, 25B) is controlled to be driven in accordance with a command from a control section 40 described later.

The main transfer mechanism 25 (25A, 25B) is placed in a space which is surrounded by: one face section at the side of the rack units U1, U2, U3; one face section at the side of liquid processing units U4, U5; and a zone wall 26. This mechanism 25 comprises a plurality of arms, for example, three arms which are retractable, freely elevated, and rotatable in a horizontal direction. The plurality of arms can be advanced or retracted independently. In addition, a multi-stepped adhesion unit (ADH) is allocated in the vicinity of the main transfer mechanism 25A. In the figure, reference numerals 27 and 28 each denote a temperature and humidity control unit which comprises a processing liquid temperature controller, a temperature and humidity control duct or the like for use in each unit.

Figure 5:
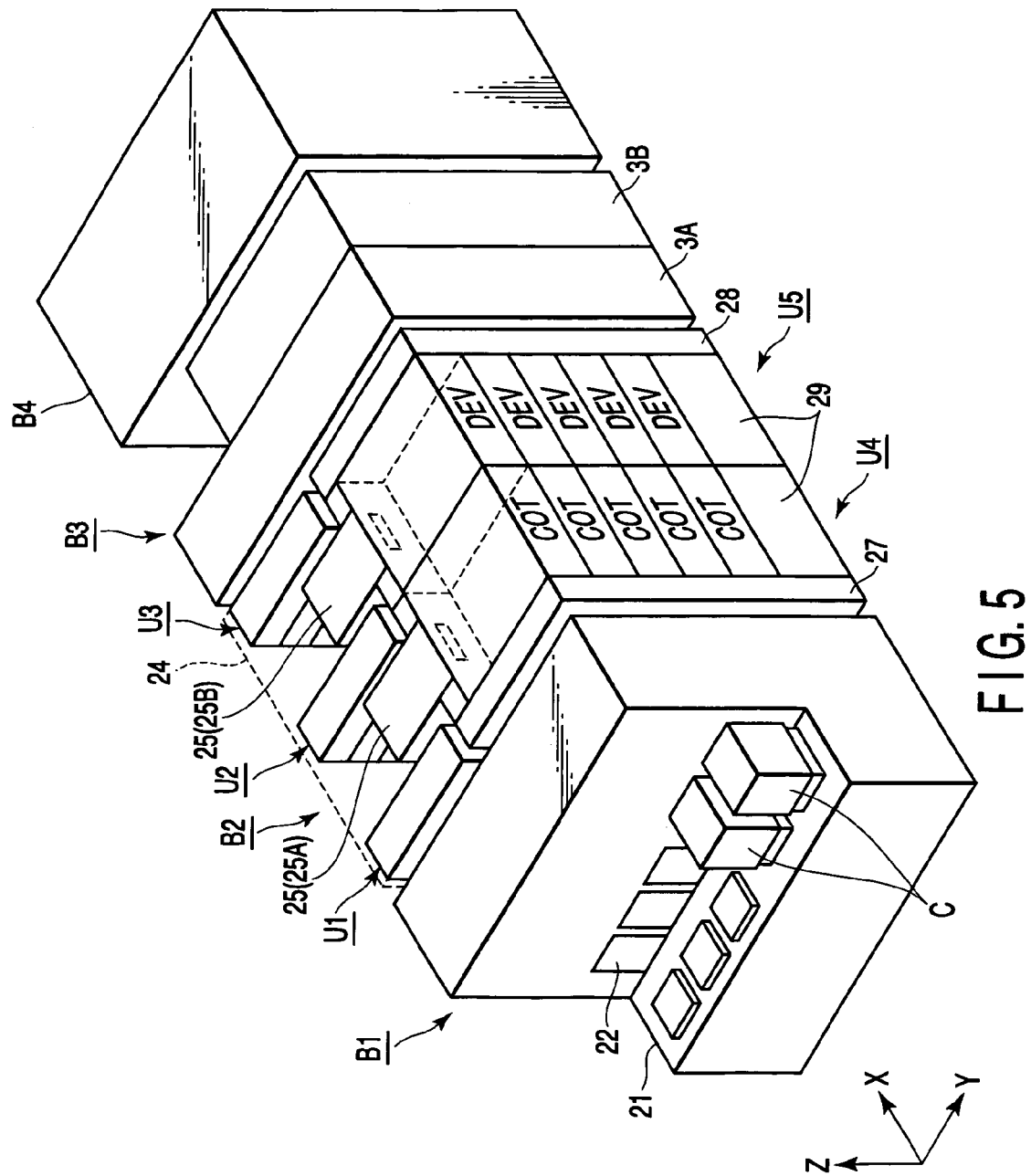
FIG. 5 is a whole schematic perspective view of the substrate processing apparatus.

The liquid processing units U4, U5 each are configured such that, for example, a coating unit (COT) and a developing unit (DEV) are laminated in five stages on a housing section 29 which forms a space for chemical supply such as a coating liquid (resist liquid) or a developing liquid, as shown in FIG. 5. The rack units U1, U2, U3 each are configured such that a variety of units for carrying out pre-processing and post-processing of a process to be carried out in the liquid processing units U4, U5 are laminated in a plurality of stages, for example, in 10 stages. In FIG. 5, the adhesion unit (ADH) is not shown.

The variety of units for carrying out pre-processing and post-processing as described above include: a temperature control unit (CPL1) for controlling the wafer W processed in the adhesion unit (ADH) to a predetermined temperature before coated with a resist liquid; a heating unit (PAB) referred to as a pre-baking unit for heating the wafer W after coating the resist liquid; a heating unit (PEB) referred to as a post exposure baking unit for heating the wafer W after exposed; a temperature control unit (CPL3) for controlling the wafer W heated by the heating unit (PEB) to a predetermined temperature before developing processing; a heating unit (POST) referred to as a post baking unit for heating the wafer W after developed; and a temperature control unit (CPL4) for cooling the wafer W heated by the heating unit (POST). FIG. 6 shows an example of a layout of these units. This layout is provided as an illustrative purpose, and in an actual apparatus, the setup number of units is determined in consideration of a processing time of each unit or the like. In addition, the rack units U1 and U3 each comprise a delivery unit (TRS1, TRS2) having a delivery base for delivering the wafer W, as shown in FIG. 6, for example. The heating units (PAB, POST) each comprise a heating plate, and are configured so as to provide accesses from both of the main transfer mechanisms 25A and 25B.

An exposure system B4 is connected via the interface block B3 rearwardly of the rack unit U3 in the processing block B2. The interface block B3 comprises: a first transfer chamber 3A and a second transfer chamber 3B which are provided forwardly and backwardly between the processing block B2 and the exposure system B4. These transfer chambers comprise a main transfer section 31A and a subsidiary transfer section 31B as a second transfer mechanism, respectively. A rack unit U6 of the first transfer chamber comprises: an edge exposure device (WEE) for selectively exposing only an edge portion of the wafer W, for example; and two buffer cassettes (SBU) each temporarily housing a plurality of wafers W (for example, 25 wafers). A rack unit U7 comprises a delivery unit (TRS3) and two high precision temperature control units (CPL2) each having a cooling plate, for example. These second transfer mechanisms 31 (31A, 31B) are controlled to be driven based on a command from a control section described later.

In the above-described substrate processing apparatus, the coating unit (COT), the developing unit (DEV), the adhesion unit (ADH), the heating unit (PAB, PEB, POST), the temperature control unit (CPL1, CPL2, CPL3, CPL4), the delivery unit (TRS1, TRS2, TRS3), the edge exposure device (WEE) and the like correspond to module groups to which wafers W are placed and are predetermined in transfer sequence. Among the module groups, a plurality of module groups which are identical to each other in transfer sequence, the module groups carrying out the same processes for wafers W, for example, the coating unit (COT), the developing unit (DEV), the adhesion unit (ADH), the heating unit (PAB, PEB, POST), the temperature control unit (CPL1, CPL2, CPL3, CPL4) and the like, correspond to multi-modules.

With respect to the module groups, the transfer arm 23, the main transfer mechanism 25 (25A, 25B), and the second transfer mechanism (subsidiary transfer mechanism) 31 take out one wafer W from the inside of the imported carrier C. Then, these elements receive the wafer W from an immediately following module in order, and then, delivers the preceding wafer W to the immediately following module. For example, after starting from the carrier C, the wafers W are sequentially transported to the immediately following modules in order, thereby executing one transfer cycle. After executing the one transfer cycle, processing goes to a next transfer cycle in which transfer cycles are sequentially executed, whereby the substrates are sequentially transferred in order from the lowest number module to the highest number module from among the module groups.

Figure 7:
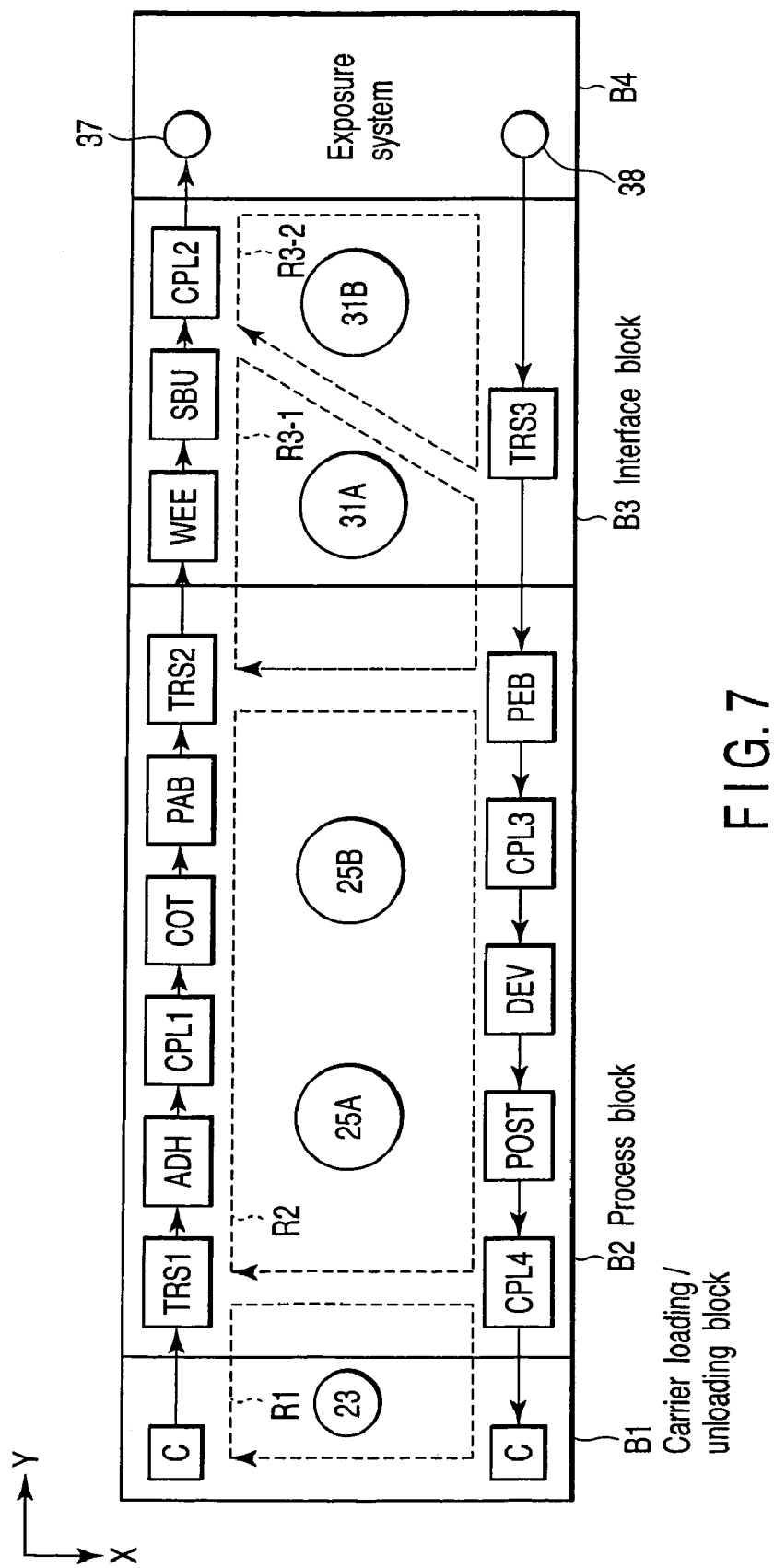
FIG. 7 is a schematic plan view of the substrate processing apparatus when a wafer transport passage is indicated by the dashed line.

Now, a transport passage of a wafer W will be described with reference to FIG. 7.

The transfer arm 23 transfers the wafer W along a route R1. That is, the wafer W before processed is transferred from the carrier C of the carrier placement block B1 to the delivery unit TRS1 along a route R2.

The main transfer mechanisms 25A, 25B transfer the wafer W along the route R2. In other words, the wafer W is transferred by the main transfer mechanisms 25A, 25B in order of the delivery unit (TRS1), the adhesion unit (ADH), the temperature control unit (CPL1), the coating unit (COT), the heating unit (PAB), and the delivery unit (TRS2).

In the interface block B3, one 31A of the second transfer mechanisms (subsidiary transfer mechanisms) 31 transfers the wafer W along a route R3-1. The other second transfer mechanism 31B transfers the wafer W along a route R3-2. In other words, the wafer W is transferred by the one second transfer mechanism 31A in order of the delivery unit (TRS2), the edge exposure device (WEE), the buffer cassette (SBU), and the temperature control unit (CPL2), and then, is transported from the temperature control unit (CPL2) to the exposure system B4 by the other second transfer mechanism 31B.

The wafer W after exposed is transferred by the second transfer mechanisms 31 (31A, 31B) in order of the delivery unit (TRS3) of the interface block B3 and the heating unit (PEB) of the processing block B2. Then, the wafer W is transferred by the main transfer mechanism 25A, 25B in order of the heating unit (PEB), the temperature control unit (CPL3), the developing unit (DEV), the heating unit (POST), and the temperature control unit (CPL4). Finally, the wafer W after processed is returned from the temperature control unit (CPL4) into the carrier C of the carrier placement block B1 by the transfer arm 23.

Because the wafer is thus transported, assuming that the multi-module is the coating unit (COT), a previous module which is a module in a previous process is obtained as the temperature control unit (CPL1). Assuming that the multi-module is the development unit (DEV), the previous module is obtained as the temperature control unit (CPL3).

Figure 8:
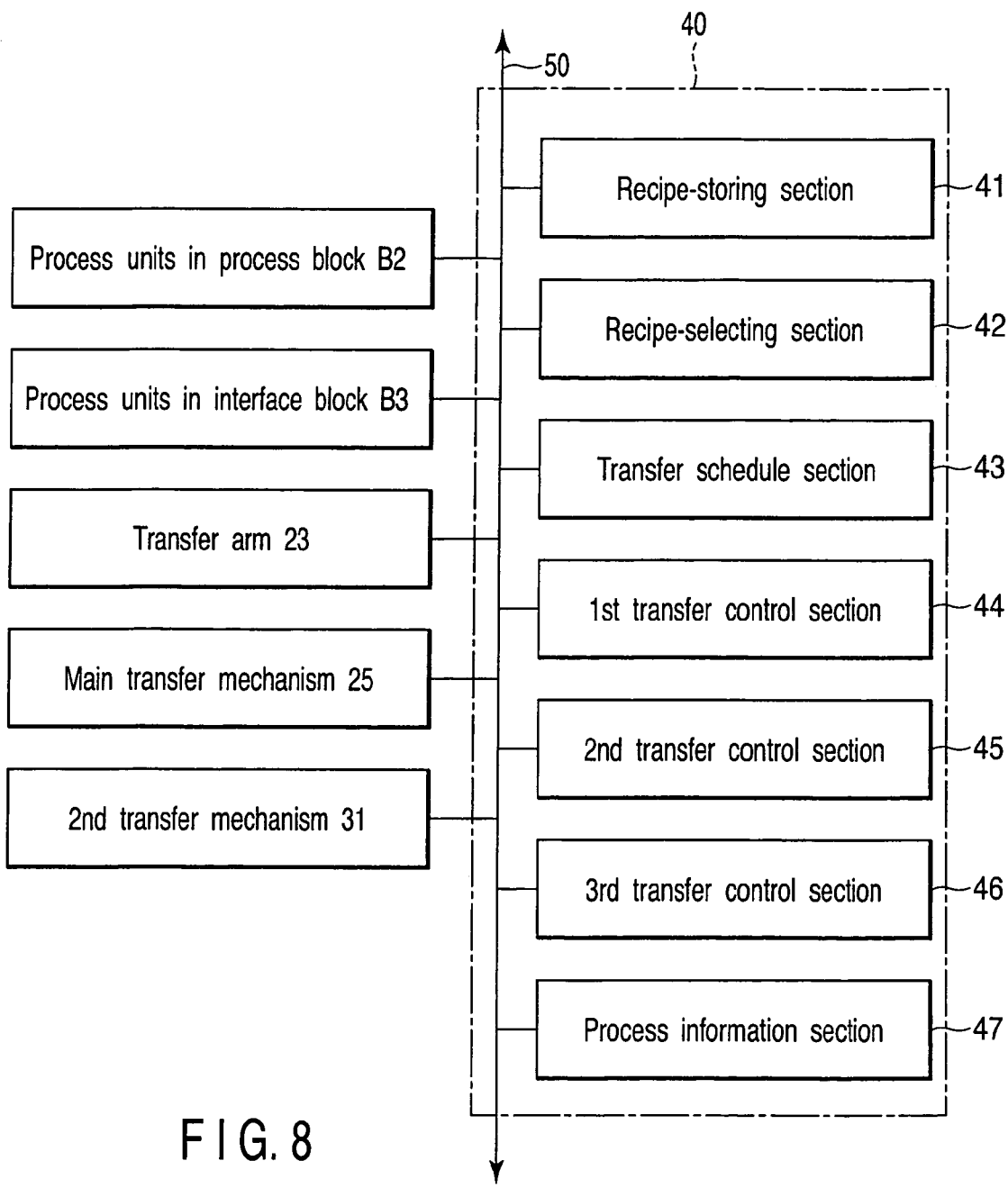
FIG. 8 is a control block diagram depicting a substrate processing apparatus according to the present invention.

Further, as described previously, the substrate processing apparatus comprises a control section 40 which carries out drive control of the main transfer mechanisms 25 (25A, 25B) and the second transfer mechanisms 31 (31A, 31B) or control of other processing units. FIG. 8 shows a configuration of the control section 40. In actuality, the control section 40 is composed of a CPU (central processing unit), a program, a memory and the like. Here, a block of some of the constituent elements will be described here.

In FIG. 8, reference numeral 50 denotes a system bus. To the bus 50, there are connected a recipe storage section 41, a recipe selecting section 42, a transfer schedule change section 43, a first transfer control section 44, a second transfer control section 45, a third transfer control section 46, and a processing information section 47, respectively.

The recipe storage section 41 stores data such as a transfer recipe, a transfer schedule and processing conditions therein. The recipe storage section 41 comprises a function for preparing a transfer schedule by using data such as a transfer recipe as well as a function for storing a variety of data.

In the present specification, the term "transfer recipe" denotes data obtained by recording a transfer passage of the wafer W. In addition, the term "transfer schedule" denotes schedule data whose contents indicating at what timing and to which unit (module) to transfer all the wafers W in a lot based on the transfer recipe. That is, the transfer schedule is obtained as data produced by allocating the wafers W in order and arranging in time series the transfer cycle data obtained by specifying the transfer cycle (phase) by associating the sequence of the wafer W and each module.

The recipe selecting section 42 is provided as a section for selecting a proper recipe from the recipes stored in the recipe storage section 41. The recipe selecting section 42 can input, for example, the number of processed wafers, resist type and the like.

The transfer schedule changing section 43 is provided as means for, when delivery of an n-th wafer W is delayed by "m" transfer cycles in a module immediately preceding the multi-modules in order, changing a schedule so that each wafer W is moved to a module to which an m-th wafer W preceding the each wafer W has been allocated with respect to a transfer schedule including n-th or subsequent wafers W (including the n-th wafer) in the multi-module transfer schedule.

The first to third transfer control sections 44 to 46 are provided as sections for executing a transfer cycle. The first transfer control section 44 controls the transfer arm 23 by referring to a transfer schedule so as to transfer a substrate written in the transfer cycle data contained in the transfer schedule to a module which corresponds to that substrate. The second transfer control section 45 controls the main transfer mechanisms 25 (25A, 25B) by referring to a transfer schedule so as to transfer a substrate written in the transfer cycle data contained in the transfer schedule to a module which corresponds to that substrate. The third transfer control section 46 controls the second transfer mechanisms 31 by referring to a transfer schedule so as to transfer the substrate written in the transfer cycle data contained in the transfer schedule to a module which corresponds to that substrate.

The processing information section 47 has a function for detecting a processing state of the wafer in the substrate processing device and sending the detecting signal to each of the sections 43 to 46 in the control section 40. The wafer processing state is detected by a sensor mounted on each transfer means 23, 25A, 25B, 31A, 31B and a sensor mounted on the wafer placement base of each processing unit. In this manner, the processing information section 47 senses in real time the processing state of the wafer in the carrier placement block B1, processing block B2, and interface block B3, whereby the control section 40 can keep track of positional information concerning which processing unit processes the wafer W.

(First Embodiment)

Now, procedures (schedule shift) for changing a transfer schedule according to a first embodiment of the present invention will be described with reference to FIGS. 3A to 3C.

First, an operator makes a recipe selection prior to starting processing of a wafer W which is a substrate. When the recipe is selected, a basic transfer schedule is selected for all the wafers contained in a lot. The control section 4 outputs a command to each section with reference to the basic transfer schedule, and processing of the wafer W is started. FIG. 3A shows an example of the basic transfer schedule when wafers W are transferred from the previous module MOD to, for example, three multi-modules MOD1 to MOD3.

In the meantime, although one wafer W is generally exported from the exposure system B4 during one cycle of the transfer schedule, exporting may be occasionally delayed. In this case, delivery of the wafer W is not carried out to the previous module MOD in accordance with the basic transfer schedule. In this case, since the processing information section 47 monitors the position of the wafer, this information is outputted to the control section 4. The control section 4 outputs a command so that the transfer schedule changing section 43 prepares a transfer schedule based on this information. Then, the transfer schedule changing section 43 makes a transfer schedule change in accordance with the technique shown in FIG. 3B as described previously. Subsequently, the wafer W is transferred based on this transfer schedule (refer to FIG. 3C) after changed.

When the transfer schedule is thus changed, although a transfer schedule table blank occurs at a portion of the previous module MOD in the phase 2 in which delivery of the wafer W2 has been delayed, a blank does not occur at any other portion. Therefore, at such a portion at which a blank does not occur, replacement of the wafers W is always carried out by means of two arms of the main transfer mechanism 25A, 25B, and thus, a replacing operation is always carried out in each processing unit. Therefore, a process for receiving the wafer W1 in one of the multi-modules MOD1 in the case where the wafer W cannot be replaced with a replacement wafer and a freewheeling taking process in the multi-module MOD1, which are described in the Description of the Related Art section, do not increase. Thus, even if there occurs a case in which delivery to the previous module MOD is delayed, the modules MOD1 to MOD3 each can always make a replacing operation of the wafers W, and can restrict the lowering of throughput.

(Second Embodiment)

Now, procedures for changing a transfer schedule according to a second embodiment of the present invention will be described with reference to FIGS. 9A and 9B.

In the present embodiment, wafers B1 to B5 in a lot B are continuously processed sequentially in the same flow of processing wafers A1 to A7 in a lot A. The "same flow" used here denotes that the wafers B1 to B5 in the lot B are processed in the same multi-modules (MOD1, MOD2, MOD3) in the same manner as the wafers A1 to A7 in the lot A.

Figures 9A, 9B:
FIGS. 9A and 9B are tables each showing a transfer schedule before and after changed as an example of the present invention.

FIG. 9A shows a state in which, in the case where delivery of the wafers A2 to A7 and wafers BL to B5 from the basic transfer schedule has been delayed in one cycle (phase), the transfer target module is shifted. FIG. 9B shows a transfer schedule after a module shift change. In this example, although the wafers A2 to A7 in the lot A and the wafers B1 to B5 are transferred in accordance with a schedule shifted from the basic transfer schedule, the wafer A1 in the lot A is transferred in accordance with the basic transfer schedule.

With respect to the wafers A2 to A7 and the wafers B1 to B4, a schedule is changed so that each wafer is moved to a module in which an "m"-th wafer following the each wafer (immediately following wafer) has been allocated in accordance with the basic transfer schedule. In addition, with respect to the wafer B5, a wafer corresponding to the basic transfer schedule does not exist. Thus, in a transfer schedule after changed, a transfer target module is shifted to the module (MOD1) to which a wafer can be transferred to a phase 14 immediately following a phase 13 in which the immediately preceding wafer B4 is transferred to the module (MOD3) in accordance with the transfer schedule after changed.

In this case as well, although a transfer schedule blank occurs at a portion of the delivery unit TRS of the phase 2 in which delivery of the wafer W2 has been delayed, a blank does not occur in any other portion. Since a replacing operation is always carried out in each processing unit, even if there occurs a case in which delivery to the delivery unit TRS is delayed, the lowering of throughput can be restricted.

(Third Embodiment)

Figures 10A, 10B:
FIGS. 10A and 10B are tables each showing a transfer schedule before and after changed as an example of the present invention.

FIG. 10A shows a state in which, in the case where delivery of wafers B1 to B5 in a lot B from a basic transfer schedule has been delayed by one cycle (phase), the transfer target module is shifted.

FIG. 10B shows a transfer schedule after shifted. In this example, although the wafers B1 to B5 in the lot B are transferred in accordance with a schedule shifted from the basic transfer schedule, wafers A1 to A7 in a lot A are transferred in accordance with the basic transfer schedule.

With respect to the wafers B1 to B4, a schedule is changed so that each wafer is moved to a module in which an "m"-th wafer following the each wafer (immediately following wafer) has been allocated in the basic transfer schedule. With respect to the wafer B5, a wafer corresponding to the basic transfer schedule does not exist. Thus, a schedule is changed so as to shift a transfer destination to the module (MOD1) in which the immediately preceding wafer B4 is transferred to the module (MOD3) in accordance with the transfer schedule after changed. In this case as well, since replacement of wafers W is always carried out in the modules MOD1, MOD3, a replacing work can be carried out smoothly, and the lowering of throughput is restricted.

(Fourth Embodiment)

Figures 11A, 11B:
FIGS. 11A and 11B are tables each showing a transfer schedule before and after changed as an example of the present invention.

FIGS. 11A and 11B each show procedures in the case where wafers B1 to B5 in a lot B following wafers A1 to A7 in a lot A are sequentially processed in accordance with a different flow. The word "different flow" used here denotes that four multi-modules (MOD1, MOD2, MOD3, MOD4) carry out processing for the wafers A1 to A7 in the lot A, and three multi-modules (MOD1, MOD2, MOD3) carry out processing for the wafers B1 to B5 in the lot B.

FIG. 11A shows a state in which, in the case where delivery of the wafers A2 to A7 in the lot A from a basic transfer schedule has been delayed by one cycle (phase), the transfer target module is shifted.

FIG. 11B shows a transfer schedule after shifted. In this example, although the wafers A2 to A7 in the lot A are transferred in accordance with a schedule shifted from the basic transfer schedule, the starting wafer A1 in the lot A and the wafers B1 to B5 in the lot B are transferred in accordance with the basic transfer schedule.

With respect to the wafers A2 to A6, a schedule is changed so that each wafer is moved to a module in which an m-th wafer following the each wafer (immediately following wafer) has been allocated in accordance with the basic transfer schedule. In addition, with respect to the wafer A7, a transfer destination is shifted to the module (MOD4) in which the immediately preceding wafer A6 can be transferred to a phase 9 immediately following a phase 8 in which the wafer is transferred to the module (MOD3) in accordance with the transfer schedule after changed. In this case as well, since replacement of wafers W is always carried out in each module, a replacing work can be carried out smoothly, and the lowering of throughput is restricted.

(Fifth Embodiment)

Figures 12A, 12B:
FIGS. 12A and 12B are tables each showing a transfer schedule before and after changed as an example of the present invention.

FIGS. 12A and 12B each show procedures in the case where wafers B1 to B5 in a lot B following wafers A1 to A7 in a lot A are sequentially processed in accordance with a different flow. The word "different flow" used here denotes that three multi-modules (MOD1, MOD2, MOD3) carry out processing for the wafers A1 to A7 in the lot A, and four multi-modules (MOD1, MOD2, MOD3, MOF4) carry out processing for wafers B1 to B5 in the lot B.

FIG. 12A shows a state in which, in the case where delivery of the wafers A2 to A7 in the lot A from the basic transfer schedule has been delayed by one cycle (phase), the transfer target module is shifted.

FIG. 12B shows a transfer schedule after shifted. In this example, although the wafers A2 to A7 in the lot A are transferred in accordance with a schedule shifted from the basic transfer schedule, the starting wafer A1 in the lot A and the wafers B1 to B5 in the lot B are transferred in accordance with the basic transfer schedule.

With respect to the wafers A2 to A6, a schedule is changed so that each wafer is moved to a module in which an "m"-th wafer following the each wafer (immediately following wafer) has been allocated in accordance with the basic transfer schedule. In addition, with respect to the wafer A7, a wafer corresponding to the basic transfer schedule does not exist. Thus, a transfer destination is shifted to the module (MOD2) in which the immediately preceding wafer A6 can be transferred to a phase 9 immediately following a phase 8 in which the wafer is transferred to the module (MOD1) in accordance with the transfer schedule after changed. In this case as well, in the module, MOD1, MOD2, since replacement of wafers W is always carried out in each module, a replacing work can be carried out smoothly, and the lowering of throughput is restricted.

(Sixth Embodiment)

Figures 13A, 13B:
FIGS. 13A and 13B are tables each showing a transfer schedule before and after changed as an example of the present invention.

FIGS. 13A and 13B each show procedures in the case where wafers B1 to B5 in a lot B following wafers A1 to A7 in a lot A are sequentially processed in accordance with a different flow. The word "different flow" used here denotes that three multi-modules (MOD1, MOD2, MOD3) carry out processing for the wafers A1 to A7 in the lot A, and four multi-modules (MOD1, MOD2, MOD3, MOF4) carry out processing for wafers B1 to B5 in the lot B.

FIG. 13A shows a state in which, in the case where delivery of the wafers A2 to A7 in the lot A from a basic transfer schedule has been delayed by one cycle (phase), the transfer target module is shifted.

FIG. 13B shows a transfer schedule after shifted. In this example, although the subsequent wafers A2 to A7 in the lot A are transferred in accordance with a schedule shifted from the basic transfer schedule, the starting wafer A1 in the lot A and wafers B1 to B5 in the lot B are transferred in accordance with the basic transfer schedule.

With respect to the wafers A2 to A6, a schedule is changed so that each wafer is moved to a module in which an m-th wafer following the each wafer (immediately following wafer) has been allocated in accordance with the basic transfer schedule. In addition, with respect to the wafer A7, a transfer schedule is rewritten so as to shift a transfer destination to the module (MOD2) in which the immediately preceding wafer A6 can be transferred to a phase 9 immediately following a phase 8 in which the wafer is transferred to the module (MOD1) in accordance with the transfer schedule after adjusted. In this case as well, since replacement of wafers W is always carried out in the modules MOD1, MOD2, MOD3, a replacing work can be carried out smoothly, and the lowering of throughput is restricted.

(Seventh Embodiment)

Figures 14A, 14B:
FIGS. 14A and 14B are tables each showing a transfer schedule before and after changed as an example of the present invention.

FIG. 14A shows a state in which, in the case where delivery of wafers A3 to A7 in a lot A from a basic transfer schedule has been delayed by one cycle (phase), the transfer target module is shifted.

FIG. 14B shows a transfer schedule after shifted. In this example, although the subsequent wafers A3 to A7 in the lot A are transferred in accordance with a schedule shifted from the basic transfer schedule, the starting wafers A1, A2 in the lot A and wafers B1 to B5 in the lot B are transferred in accordance with the basic transfer schedule.

With respect to the wafers A3 to A6, a schedule is changed so that each wafer is moved to a module in which an m-th wafer following the each wafer (immediately following wafer) has been allocated in accordance with the basic transfer schedule. In addition, with respect to the wafer A7, a transfer schedule is rewritten so as to shift a transfer destination to the module (MOD2) in which the immediately preceding wafer A6 can be transferred to a phase 9 immediately following a phase 8 in which the wafer is transferred to the module (MOD1) in accordance with the transfer schedule after adjusted. In this case as well, since replacement of wafers W is always carried out in the modules MOD1, MOD2, a replacing work can be carried out smoothly, and the lowering of throughput is restricted.

(Eighth Embodiment)

Figure 16:
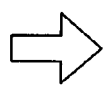
FIG. 16 is table showing a transfer schedule before and after changed as an example of the present invention.

FIGS. 15A, 15B, and 16 each show procedures in the case where wafers B1 to B5 in a lot B following wafers A1 to A7 in a lot A are sequentially processed in a difference flow. The word "different flow" used here denotes that three multi-modules (MOD1, MOD2, MOD3) carry out processing for the wafers A1 to A7 in the lot A, and three multi-modules (MOD1, MOD2, MOF4) carry out processing for wafers B1 to B5 in the lot B.

FIG. 15A shows a state in which, in the case where delivery of the subsequent wafers AS to A7 in the lot A has been delayed from a basic transfer schedule, the transfer target module is shifted. FIG. 15B shows a transfer schedule after shifting the subsequent wafers A5 to A7, and further, shows a state in which, in the case where delivery of the wafers B1 to B5 in the lot B has been delayed by one cycle (phase), the transfer target module is shifted.

In the present embodiment, the wafers A5 to A7 are sequentially delivered to the previous module MOD in phases 7 to 9. On the other hand, the wafers B1 to B5 in the lot B are sequentially delivered to the previous module MOD in phases 11 to 15 (shifted from the basic transfer schedule). In the subsequent phases, the wafers B1 to B5 are sequentially transferred to the multi-modules (MOD1, MOD2, MOD3, MOD4) in accordance with the changed transfer module. FIG. 16 shows a transfer schedule after shifted.

(Ninth Embodiment)

Further, FIGS. 17A and 17B and FIGS. 18A and 18B each show procedures in the case where wafers B1 to B5 in a lot B following wafers A1 to A7 in a lot A are sequentially processed in the same flow and in the case where an importing interval is present between the lot A and the lot B (importing interval corresponding to three transfer cycles in this case).

Figures 17A, 17B:
FIGS. 17A and 17B are tables each showing a transfer schedule before and after changed as an example of the present invention.

FIG. 17A shows a state in which, in the case where delivery of the wafers A1 to A7 and the wafers B1 to B5 from a basic transfer schedule has been delayed by one cycle (phase), the transfer target module is shifted. In addition, this figure shows an outlook in which, in the case where delivery of the wafers A2 to A7 and the wafers B1 to B5 has been further delayed by one cycle, namely, in the case where the wafer A2 has been delivered to the previous module MOD in the phase 4, a module which is a transfer destination is shifted.

(Tenth Embodiment)

Figures 18A, 18B:
FIGS. 18A and 18B are tables each showing a transfer schedule before and after changed as an example of the present invention.

FIG. 18A shows a state of a transfer schedule after module shifting in the case where a wafer A2 is delivered to a previous module in a phase 4. This figure also shows a state in which, in the case where delivery of wafers A2 to A7 and wafers B1 to B5 has been further delayed by one cycle, namely, in the case where the wafer A2 has been delivered to the previous module MOD in a phase 5, the transfer target module is shifted. In addition, FIG. 18B shows a transfer schedule after module shift adjustment in the case where the wafer A2 has been delivered to the previous module in the phase 5.

(Eleventh Embodiment)

Further, FIGS. 19A and 19B and FIGS. 20A and 20B each show procedures in the case where wafers B1 to B5 in a lot B following wafers A1 to A7 in a lot A are sequentially processed in a different flow and in the case where an importing interval is present between the lot A and the lot B (importing interval corresponding to three transfer cycles in this case). The word "different flow" used here denotes that processing is carried out for the wafers A1 to A7 in the lot A by means of three multi-modules (MOD1, MOD2, MOD3), and processing is carried out for the wafers B1 to B5 in the lot B by means of three multi-modules (MOD1, MOD2, MOD4).

Figures 19A, 19B:
FIGS. 19A and 19B are tables each showing a transfer schedule before and after changed as an example of the present invention.

FIG. 19A shows an outlook in which, in the case where delivery of the wafers A2 to A7 and wafers B1 to B5 has been delayed by one cycle, a module which is a transfer destination is shifted together with a basic transfer schedule. FIG. 19B shows a state in which, in the case where delivery of the wafers A2 to A7 and the wafers B1 to B5 has been delayed by one cycle, a module which is a transfer destination is shifted. In addition, FIG. 19B shows a state in which, in the case where delivery of the wafers A2 to A7 and wafers B1 to B5 has been further delayed by one cycle (phase), namely in the case where the wafer A2 has been delivered to the previous module MOD in the phase 4, a module which is a transfer destination is shifted.

(Twelfth Embodiment)

FIG. 20A shows a transfer schedule after module shifting in the case where a wafer A2 is delivered to a previous module in a phase 4. In addition, this figure shows a state in which, in the case where delivery of wafers A2 to A7 and wafers B1 to B5 has been further delayed by one cycle (phase), namely in the case where the wafer A2 has been delivered to the previous module MOD in a phase 5, a module which is a transfer destination is shifted. FIG. 20B shows a transfer schedule after shifted.

(Thirteenth Embodiment)

Figures 21A, 21B:
FIGS. 21A and 21B are tables each showing a transfer schedule before and after changed as an example of the present invention.

FIGS. 21A and 21B each show procedures in the case where wafers B1 to B5 in a lot B following wafers A1 to A7 in a lot A are sequentially processed in a different flow. The word "different flow" used here denotes that processing is carried out for the wafers A1 to A7 in the lot A by means of three multi-modules (MOD1, MOD2, MOD3), and processing is carried out for the wafers B1 to B5 in the lot B by means of three multi-modules (MOD1, MOD 2, MOD4).

FIG. 21A shows an outlook in which, in the case where delivery of wafers A2 to A7 has been delayed from a basic transfer schedule by two cycles (phases), a module which is a transfer destination is shifted. In addition, FIG. 21B shows a transfer schedule after shift adjustment.

In this case, in the basic transfer schedule, an importing interval corresponding to four transfer cycles is present between the lot A and the lot B. Even if wafer delivery is delayed by two cycles, the original importing interval is more than such delivery. Thus, in this example, the importing interval is defined as two transfer cycles after changed. A transfer schedule may be adjusted in this manner.

(Fourteenth Embodiment)

FIGS. 22A and 22B and FIGS. 23A and 23B each show procedures in the case where wafers B1 to B5 in a lot B following wafers A1 to A7 in a lot A are sequentially processed in a different flow and in the case where an importing interval is present between the lot A and the lot B (importing interval corresponding to five transfer cycles in this case). The word "different flow" used here denotes that processing is carried out for the wafers A1 to A7 in the lot A by means of three multi-modules (MOD1, MOD2, MOD3), and processing is carried out for the wafers B1 to B5 in the lot B by means of three multi-modules (MOD1, MOD2, MOD4).

Figures 22A, 22B:
FIGS. 22A and 22B are tables each showing a transfer schedule before and after changed as an example of the present invention.

FIG. 22A shows an outlook in which, in the case where delivery of the wafers A2 to A7 and the wafers B1 to B5 has been delayed by one cycle, a module to be transported is shifted together with a basic transfer schedule. In addition, FIG. 22B shows a transfer schedule after module shifting in the case where delivery of the wafers A2 to A7 and the wafers B1 to B5 has been delayed by one cycle. In addition, FIG. 22B shows a state in which, in the case where delivery of the wafers A2 to A7 and the wafers B1 to B5 has been further delayed by one cycle (phase), namely in the case where the wafer A2 has been delivered to the previous module MOD in the phase 4, the transfer target module is shifted.

(Fifteenth Embodiment)

Figure 23A:
FIGS. 23A and 23B are tables each showing a transfer schedule before and after changed as an example of the present invention.
Figure 23B:

FIG. 23A shows a transfer schedule after module shifting in the case where a wafer A2 is delivered to a previous module MOD in a phase 4. This figure also shows a state in which, in the case where delivery of the wafers B1 to B5 has been further delayed by one cycle (phase), namely in the case where the wafer A2 is delivered to the previous module MOD in a phase 5, a module which is a transfer destination is shifted. FIG. 23B shows a transfer schedule after shifted.

According to the present invention, in a module immediately preceding multi-modules in order, even if substrate delivery has been delayed, multi-modules which are substrate transfer destinations are changed so as to prevent freewheeling of substrates in the multi-modules. Therefore, the multi-modules receive processed substrates by transfer means, an operation for delivering a new substrate is carried out, so that the lowering throughput can be restricted.

The present invention can be applied to transfer of a wafer W by a second transfer mechanism. Further, the present invention can be applied to a substrate processing apparatus for processing s substrate such as a glass substrate for a liquid crystal display (LCD substrate) as well as a semiconductor wafer. Furthermore, the present invention is not limited to a resist coating and developing apparatus. For example, the present invention can be applied to a system for coating a material for an insulation film to a substrate by a processing apparatus, followed by carrying out a gelling process by a delivery processing unit, for example, followed by taking out the material by first transfer means to sequentially transfer the materials to a baking unit, a curing unit, and a substrate exporting section.

What is claimed is:

1. A substrate processing apparatus comprising:
a module group which sequentially processes a plurality of substrates in parallel, the module group having multi-modules substrates to be transferred in identical order and composed of a plurality of modules which carry out identical processing for substrates, and including a previous module to which substrates are transferred immediately before the multi-modules;
a delivery mechanism configured to deliver substrates to the previous module; and
a plurality of transfer mechanism configured to transfer substrates, respectively, to modules in the module group, the apparatus comprising:
a recipe storage section which allocates a sequence to a substrate so that the substrates are delivered in a predetermined sequence from the previous module to each module of the multi-modules, specifies a transfer cycle by associating the sequence of the substrate with said each module, creates a transfer schedule by arranging the specified transfer cycle data in time series, and stores the created transfer schedule;
a transfer control section which calls the transfer schedule from the recipe storage section, and controls the transfer mechanism so as to transfer a substrate written into the transfer cycle data to a module which corresponds to the substrate; and
a transfer schedule changing section which, when delivery of an n-th substrate from the delivery mechanism to the previous module is delayed by "m" cycles, changes the transfer schedule so as to move each of n-th and subsequent substrates including the n-th substrate in the transfer schedule to a module to which an "m"-th substrate following the substrate has been allocated, and transfers the changed transfer schedule data to the transfer control section.

2. The apparatus according to claim 1, wherein
the transfer control section controls each operation of the transfer mechanism based on the transfer schedule, whereby each transfer mechanism delivers a substrate from one module, receives a substrate from a next module to deliver a previous substrate in the next module, transfers a substrate placed in each module to an immediately following module in order, whereby one transfer cycle is executed, processing is moved to a next transfer cycle after executing the one transfer cycle, and substrates are sequentially transferred from a lower number module to a higher number module in the module group by sequentially executing the transfer cycles.

3. The apparatus according to claim 1, wherein
the transfer mechanism comprises:
a transfer arm as the delivery mechanism;
a main transfer mechanism which transfers substrates delivered to the previous module to the multi-modules; and
a subsidiary transfer mechanism which transfers the substrates processed by the multi-modules to another module, and
the transfer control section comprises:
a first transfer control section which refers to the transfer schedule to control the transfer arm so as to transfer a substrate written in the transfer cycle data in the transfer schedule to a module which corresponds to the substrate;
a second transfer control section which refers to the transfer schedule to control the main transfer mechanism arm so as to transfer a substrate written in the transfer cycle data in the transfer schedule to a module which corresponds to the substrate; and
a third transfer control section which refers to the transfer schedule to control the subsidiary transfer mechanism so as to transfer a substrate written in the transfer cycle data in the transfer schedule to a module which corresponds to the substrate.

4. The apparatus according to claim 1, further having a recipe selecting section which selects a predetermined recipe from the recipe storage section.

5. The apparatus according to claim 1, further having:
means for detecting a processing state of each substrate; and
a processing information section which identifies a current position of a substrate based on the detected processing state, and provides positional information on the substrate to the transfer control section.

6. A substrate processing method for processing a substrate by using a substrate processing apparatus comprising:
a module group which sequentially processes a plurality of substrates in parallel, the module group having multi-modules substrates to be transferred in identical order and composed of a plurality of modules which carry out identical processing for substrates, and including a previous module to which substrates are transferred immediately before the multi-modules;
a delivery mechanism configured to deliver substrates to the previous module; and
a plurality of transfer mechanism configured to transfer substrates, respectively, to modules in the module group, the substrate processing method distributing substrates in a predetermined order from the previous module to each module of the multi-modules, comprising:
(a) a step of allocating a sequence to a substrate so that the substrates are delivered in a predetermined sequence from the previous module to each module of the multi-modules, specifying a transfer cycle by associating the sequence of the substrate with said each module; creating a transfer schedule by arranging the specified transfer cycle data in time series, referring to the created transfer schedule, and transferring a substrate written in the transfer cycle data by the transfer mechanism to a module which corresponds to the substrate;
(b) a step of calling the transfer schedule, and controlling the transfer mechanism so as to transfer a substrate written into the transfer cycle data to a module which corresponds to the substrate;
(c) a step of, when delivery of an n-th substrate from the delivery mechanism to the previous module is delayed by "m" cycles, changing the transfer schedule so as to move each of n-th and subsequent substrates including the n-th substrate in the transfer schedule to a module to which an "m"-th substrate following the substrate has been allocated; and
(d) a step of, referring to the changed transfer schedule, transferring a substrate written in the transfer cycle data to a module which corresponds to the substrate.

7. A program to be executed by a computer system, the program comprising:

(a) a procedure for executing processing of allocating a sequence to a substrate so that substrates are delivered in a predetermined sequence from a previous module to each module of multi-modules, specifying a transfer cycle by associating the sequence of the substrate with said each module, creating a transfer schedule by arranging the specified transfer cycle data in time series, referring to the created transfer schedule, and transferring a substrate written in to the transfer cycle data to a module which corresponds to the substrate;

(b) a procedure for executing processing of calling the transfer schedule, and controlling a transfer mechanism so as to transfer a substrate written into the transfer cycle data to a module which corresponds to the substrate;

(c) a procedure for executing processing of, when delivery of an n-th substrate from a delivery mechanism to the previous module is delayed by "m" cycles, changing the transfer schedule so as to move each of n-th and subsequent substrates including the n-th substrate in the transfer schedule to a module to which an "m"-th substrate following the substrate has been allocated; and (d) a procedure of referring to the changed transfer schedule, and causing the transfer mechanism to transfer a substrate written in the transfer cycle data to a module which corresponds to the substrate.

\* \* \* \* \*